(12) United States Patent
Budker et al.

(10) Patent No.: US 8,587,304 B2
(45) Date of Patent: Nov. 19, 2013

(54) OPTICAL ATOMIC MAGNETOMETER

(75) Inventors: Dmitry Budker, El Cerrito, CA (US); James Higbie, Berkeley, CA (US); Eric P. Corsini, Santa Maria, CA (US)

(73) Assignee: The Regents of The University of California, Oakland, CA (US)

( * ) Notice: Subject to any disclaimer, the term of this patent is extended or adjusted under 35 U.S.C. 154(b) by 552 days.

(21) Appl. No.: 12/675,685

(22) PCT Filed: Sep. 4, 2008

(86) PCT No.: PCT/US2008/075280
§ 371 (c)(1),
(2), (4) Date: Aug. 24, 2010

(87) PCT Pub. No.: WO2009/073256
PCT Pub. Date: Jun. 11, 2009

(65) Prior Publication Data
US 2011/0025323 A1 Feb. 3, 2011

Related U.S. Application Data

(60) Provisional application No. 60/970,242, filed on Sep. 5, 2007.

(51) Int. Cl.
*G01R 33/26* (2006.01)
(52) U.S. Cl.
USPC ............................................. 324/304
(58) Field of Classification Search
USPC ..................................... 324/304, 300, 301
See application file for complete search history.

(56) References Cited

U.S. PATENT DOCUMENTS

| | | | | |
|---|---|---|---|---|
| 3,467,856 | A | * | 9/1969 | Hearn ........................... 324/304 |
| 3,495,161 | A | * | 2/1970 | Bell .............................. 324/304 |
| 4,327,327 | A | * | 4/1982 | Greenwood et al. .......... 324/304 |
| 4,812,767 | A | | 3/1989 | Taketomi |
| 6,650,682 | B1 | * | 11/2003 | Jones et al. ...................... 372/94 |
| 8,421,455 | B1 | * | 4/2013 | Hovde et al. .................. 324/305 |
| 2003/0189887 | A1 | | 10/2003 | Dang et al. |
| 2006/0227845 | A1 | * | 10/2006 | Degertekin et al. ........... 372/102 |
| 2007/0120563 | A1 | | 5/2007 | Kawabata et al. |
| 2007/0167723 | A1 | | 7/2007 | Park et al. |
| 2007/0205767 | A1 | | 9/2007 | Xu et al. |
| 2010/0289491 | A1 | * | 11/2010 | Budker et al. ................ 324/304 |

OTHER PUBLICATIONS

Tsung-Chih Yu ; Yu-Lung Lo; Using a new liquid-crystal polarization modulator for a polarimetric glucose sensor. Proc. SPIE 5852, Third International Conference on Experimental Mechanics and Third Conference of the Asian Committee on Experimental Mechanics, 21 (Jun. 3, 2005); doi:10.1117/12.621220.*

(Continued)

*Primary Examiner* — Melissa Koval
*Assistant Examiner* — Rishi Patel
(74) *Attorney, Agent, or Firm* — Knobbe, Martens, Olson & Bear LLP

(57) ABSTRACT

An optical atomic magnetometers is provided operating on the principles of nonlinear magneto-optical rotation. An atomic vapor is optically pumped using linearly polarized modulated light. The vapor is then probed using a non-modulated linearly polarized light beam. The resulting modulation in polarization angle of the probe light is detected and used in a feedback loop to induce self-oscillation at the resonant frequency.

26 Claims, 15 Drawing Sheets

(56) References Cited

OTHER PUBLICATIONS

Alexandrov et al., Dynamic Effects in Nonlinear Magneto-Optics of Atoms and Molecules: Review, J. Opt. Soc. Am. B, Jan. 2005, pp. 7-20, vol. 22, No. 1, Optical Society of America.

Bell et al., Optically Driven Spin Precession, Physical Review Letters, Mar. 15, 1961, pp. 280-281, vol. 6, No. 6.

Budker et al., Optical Magnetometry, arXiv:physics [physics.atom-ph], Nov. 26, 2006, pp. 1-11, 0611246v1.

Budker et al., UC Berkeley Magnetometer + Gradiometer Based on Amplitude Modulation Non-Linear Magneto Optical Rotation, Second Annual Multidisciplinary University Research Initiative (MURI) Review Meeting at NIST, Bolder, CO, Jul. 18-20, 2007, pp. 1-44.

Chéron et al., A New Optical Pumping Scheme Using a Frequency Modulated Semi-Conductor Laser for 4He Magnetometers, Optics Communications, Mar. 1, 1995, pp. 71-74, vol. 115, Elsevier Science B.V.

Gawlik et al., Nonlinear Magneto-Optical Rotation with Amplitude Modulated Light, Applied Physics Letters, 2006, pp. 131108-1-131108-3, vol. 88, American Institute of Physics.

Harel et al., Spectrally Resolved Flow Imagining of Fluids Inside a Microfluidic Chip with Ultrahigh Time Resolution, Journal of Magnetic Resonance, 2008, pp. 199-206, vol. 193, Elsevier.

Higbie et al., Robust, High-Speed, All-Optical Atomic Magnetometer, Review of Scientific Instruments, 2006, p. 113106-1-113106-7, vol. 77, American Institute of Physics.

Higbie et al., Robust, High-Speed, All-Optical Atomic Magnetometer, arXiv:physics [physics.atom-ph] Sep. 6, 2006, pp. 1-8, 0609061v1.

Kanorsky et al., Quantitative Investigation of the Resonant Nonlinear Faraday Effect Under Conditions of Optical Hyperfine Pumping, Physical Review A, Feb. 1993, pp. 1220-1226, vol. 47, No. 2, The American Physical Society.

PCT, International Search Report and Written Opinion, for Application No. PCT/US 08/75280, dated May 5, 2009.

Pustelny et al., Pump-Probe Nonlinear Magneto-Optical Rotation with Frequency-Modulated Light, Physical Review A, 2006, pp. 023817-1-023817-11, vol. 73, The American Physical Society.

\* cited by examiner

OPTICAL ATOMIC MAGNETOMETER

RELATED APPLICATIONS

This application claims the benefit of U.S. Provisional Application No. 60/970,242, filed Sep. 5, 2007, which is incorporated herein by reference in its entirety.

STATEMENT REGARDING FEDERALLY SPONSORED R&D

The U.S. Government has a paid-up license in this invention and the right in limited circumstances to require the patent owner to license others on reasonable terms as provided for by the terms of Contract No. DE-AC02-05CH11231 awarded by the Department of Energy.

BACKGROUND

1. Field of the Invention

The present invention relates to magnetometers.

2. Description of the Related Art

Several applications require the detection of magnetic field strength. Examples of such applications include both pure science endeavors as well as practical applications. Pure science investigations that require the use of sensitive magnetometers include the detection of planetary and solar magnetic fields and the detection of an electric dipole moment in elementary particles. Practical applications of magnetometers include the detection of unexploded ordnance, location of buried objects at land or sea (e.g., treasure), mining surveys, detection of submarines or mines, detection of vehicles, detection of signals from the brain (magnetoencephalography) or heart (magnetocardiography), and magnetic-resonance imaging. Although several commercial magnetometers exist, they suffer from low sensitivity, lack of compactness, and/or high energy demands. Thus, there is an unmet need for improved magnetometers.

SUMMARY OF THE INVENTION

One embodiment disclosed herein includes a magnetometer comprising a container comprising atomic vapor, a first linearly polarized light source configured to irradiate the atomic vapor, a second linearly polarized light source configured to transmit light through the atomic vapor, a light polarization detector configured to detect a polarization angle of the light transmitted through the atomic vapor from the second linearly polarized light source, and a light modulator configured to modulate the frequency or amplitude of light emitted by the first linearly polarized light source in response to the polarization detected by the light polarization detector.

Another embodiment disclosed herein includes a gradiometer that comprises at least two of the magnetometers described above.

Another embodiment disclosed herein includes a method for detecting magnetic field strength, the method including optically pumping an atomic vapor such that the vapor becomes dichroic or birefringent, transmitting non-modulated linearly polarized light through the atomic vapor, detecting a modulation of polarization angle of the transmitted light, and modulating the optical pumping of the atomic vapor in response to the detected modulation of polarization angle.

DETAILED DESCRIPTION OF THE CERTAIN EMBODIMENTS

One embodiment includes a magnetometer that utilizes nonlinear magneto-optical rotation (NMOR) with a modulated pump light source and a non-modulated probe light source. An NMOR resonance occurs when optical pumping causes an atomic vapor to become dichroic (or birefringent), so that subsequent probe light experiences polarization rotation. In one embodiment, both pump and probe light are linearly polarized and therefore primarily produce and detect atomic alignment ($\Delta m=2$ coherences). Magnetic-field dependence of the polarization rotation originates from the fact that the atomic spins undergo Larmor precession in the presence of an external magnetic field. Weak optical pumping can only produce a macroscopic alignment when the Larmor precession frequency is small compared to the spin relaxation rate, or alternatively, when optical pumping is modulated nearly synchronous with precession. If the optical-pumping rate is modulated at a frequency $v$, then the optical-rotation angle of the probe polarization will in general also oscillate at frequency $v$. The optical-pumping beam may either be amplitude modulated or frequency modulated. If the modulating frequency is scanned across the resonance, then the NMOR resonance will manifest itself as a resonant peak in the rotation-angle amplitude of the probe polarization. This resonant frequency may then be related to the external magnetic field strength. Assuming the in-going probe and pump polarizations to be parallel, the amplitude and phase of the observed rotation signal can be described by the complex Lorentzian $(\delta - i\gamma/2)-1$, where $\delta \equiv 2\pi(v - 2v_L)$ is the detuning from resonance, γ is the full width (in modulation frequency) at half maximum of the resonance, and $v_L$ is the Larmor frequency. The phase shift relative to the pump modulation as a function of δ is seen by taking the argument of this complex Lorentzian to be:

$$\phi = \frac{\pi}{2} + \tan^{-1}\left(\frac{2\delta}{\gamma}\right) \quad (1)$$

In one embodiment, self-oscillation is induced in the above-described system by introducing a feedback mechanism such that the optical pump beam is modulated in response to the modulation detected in the probe beam optical rotation. In this embodiment, the frequency of modulation of the optical pump beam does not need to be scanned in order to detect the resonance frequency. Instead, the system will spontaneously self-oscillate at the resonant frequency. In some embodiments, the system will self-oscillate by merely energizing pump and probe beams, provided the feedback mechanism is in place. In other embodiments, the optical pump may initially be driven at a seed frequency and then allowed to drift to the self-oscillation resonant frequency.

Figure 1:
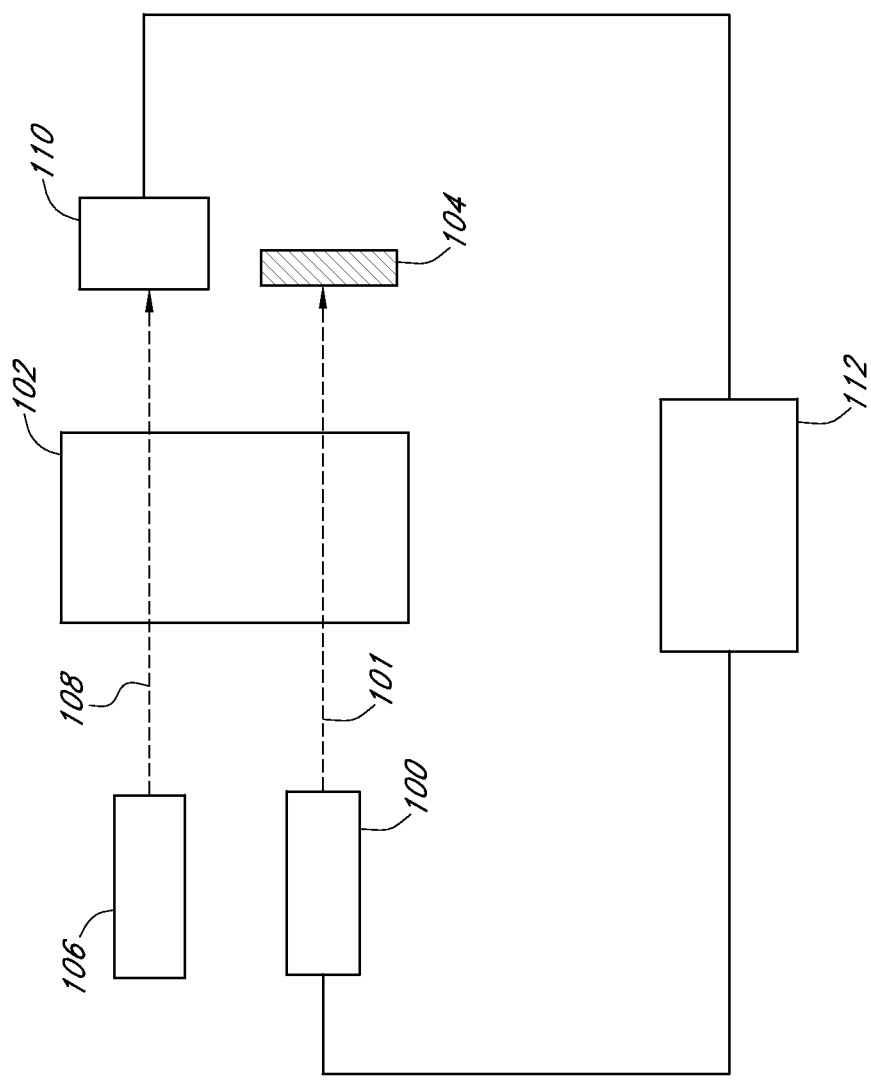
FIG. 1 is a system block diagram of an optical atomic magnetometer.

One embodiment of a magnetometer utilizing the above-described principles is depicted by the block diagram in FIG. 1. A polarized optical pump light source 100 emits a beam 101 through a chamber 102 comprising an atomic vapor. The atomic vapor may be any suitable composition. In one embodiment, the atomic vapor comprises an alkali metal (e.g., sodium, potassium, rubidium, or cesium). The wavelength produced by the optical pump light source may be selected to produce the desired optical pumping of the atomic vapor. For example, when gaseous rubidium is used in the chamber 102, a diode laser on the D2 line of rubidium may be used. In one such embodiment, the pump light may be frequency-stabilized approximately 300 MHz below the center of the F=2→F' Doppler-broadened line using a dichroic atomic vapor laser lock. The pump light 101 may also be amplitude- or frequency-modulated. After the pumping light 101 passes through the vapor in the chamber 102, it may be absorbed by an optical absorber 104.

The chamber 102 may be any container suitable for holding the atomic vapor and permitting pump and probe light beams to pass through the walls of the container. For example, the chamber 102 may be glass or contain glass windows. In some embodiments, the chamber 102 is constructed to resist relaxation of the induced atomic alignment. In one embodiment, anti-relaxation properties are achieved by coating the interior of the chamber 102 with paraffin. Alternative coatings or chamber 102 materials may also be used to achieve anti-relaxation properties.

As noted above, the optical pumping may be such that the atomic vapor becomes dichroic and thus rotates the polarization of polarized light. Thus, a polarized probe light source 106 may be provided to detect this rotation. The probe light source 106 directs a probe light beam 108 through the chamber 102. The probe light source 106 may have the same wavelength as the pump light source 100. In one embodiment, a single laser is used to provide both probe 108 and pump 101 light. The light from the single laser may be split, further modified, and directed into the chamber 102 using one or more optical elements (e.g., mirrors, splitters, and polarizers) and/or optical fibers. In this context, the term "light source" may refer to the combination of light generator (e.g., laser) and elements that cause light to be directed into the chamber 102. Although the pump 101 and probe 108 light beams are depicted as being parallel in the chamber 102, it will be appreciated that other relative angles between the two beams are operable.

After passing through the chamber 102, the polarization rotation of the probe light 108 may be detected by polarization detector 110. As discussed above, if the optical pump light is modulated, the polarization rotation of the probe light 108 will also modulate. The resulting modulation signal from the polarization detector 110 may be used to control a modulator driver 112 that controls the modulation of the pump light source 100. Thus, a feedback loop is created that allows for self-oscillation of the magnetometer at twice the Larmor frequency. The modulation frequency may then be used to determine the strength of any external magnetic fields.

Optical pumping by linearly polarized light favors the preparation of a state whose alignment symmetry axis is parallel to the pump polarization. At the center of the NMOR resonance, therefore, where there is no phase lag between pumping and precession, the precessing axis of atomic alignment is parallel to the pump polarization at the moment of maximal optical pumping in the limit of short pump pulses. Consequently, if the probe polarization is parallel to the pump polarization, the probe polarization rotation signal will pass through zero at the same moment, so that this optical rotation signal is 90° out of phase with the pump modulation. This phase difference can be seen in equation 1. To facilitate self-oscillation in the case where the pump 101 and probe 108 light beams have parallel polarization, the detected polarization rotation signal waveform may be shifted by −90° before being fed back as pump modulation in order for coherent buildup at the central resonant frequency to occur. Deviations from this phase shift will result in oscillation away from line center in such a way as to maintain zero total phase around the loop, so long as the magnitude of the gain is sufficient to sustain oscillation at the shifted frequency. In one embodiment, the modulator driver 112 includes an analog filter network capable of generating accurate and stable 90° phase shifts over a broad range of frequencies. In another embodiment, digital phase shifters within the modulator driver 112 are utilized to effect the phase shift. In still another embodiment, a phase-locked loop may be employed with a local oscillator stabilized in quadrature with the detected signal to produce a 90° phase shift.

In one embodiment, an all-optical method is used to shift the relative phase between the pump modulation and the optical rotation of the probe light beam 108 through the atomic vapor. Since the rotation of the probe light 108 polarization is determined by the angle of the incident polarization with respect to the axis of atomic alignment, which itself rotates uniformly in time, a fixed rotation of the incoming probe polarization is equivalent to a translation in time of the output signal, i.e., a phase shift. Since this phase shift is purely geometrical, it has no frequency dependence, and possesses long-term stability. Accordingly, in some embodiments, light sources 100 and 106 produce polarized light at angles relative to each other sufficient to induce a 90° phase shift such that the modulation of polarization angle detected by the polarization detector 110 may used to drive the modulation of the pump light source 110 without any electrical phase shifting.

Figure 2:
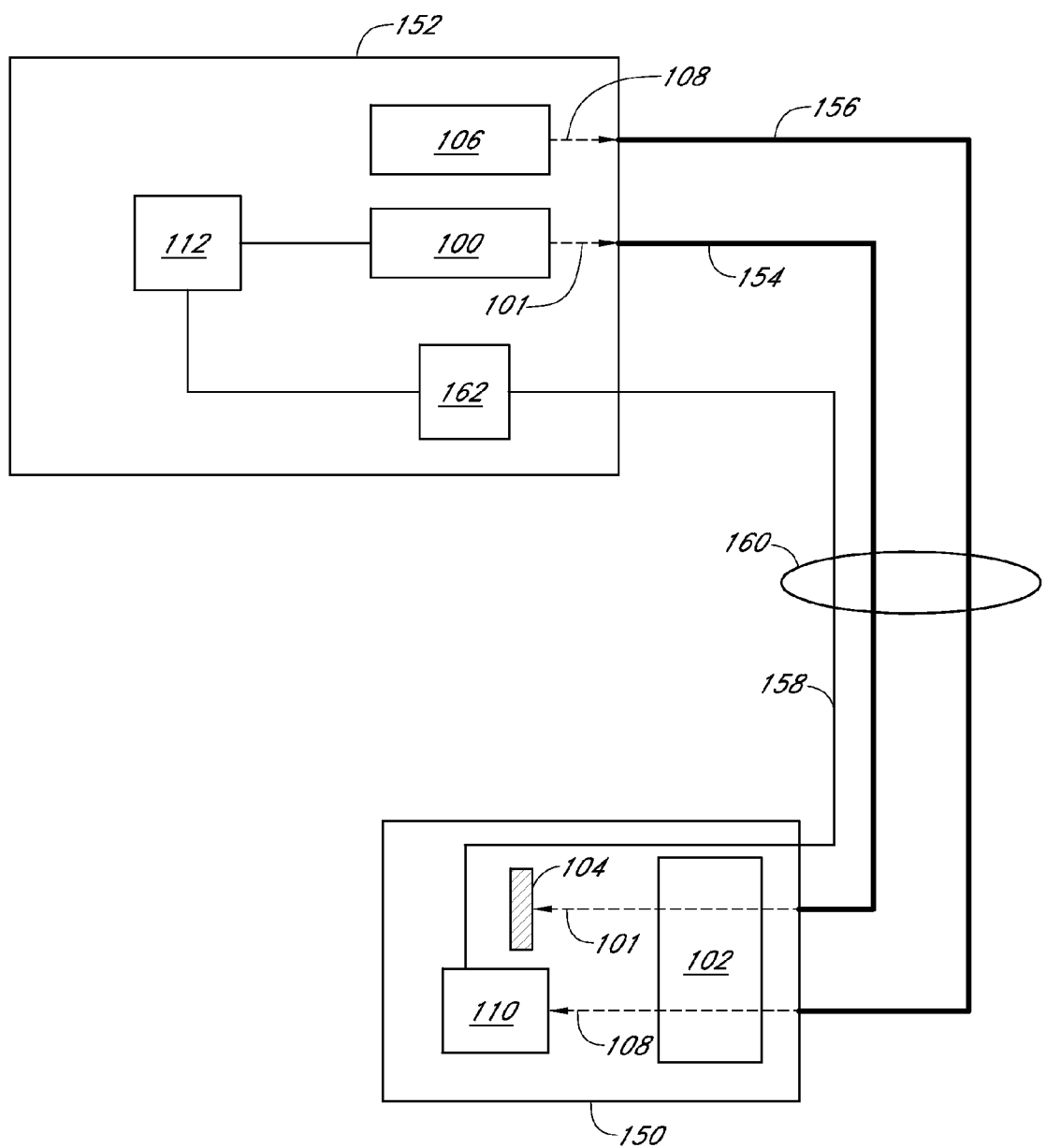
FIG. 2 is a system block diagram of an optical atomic magnetometer having separate signal processing and sensing head modules.

FIG. 2 is a system block diagram illustrating one embodiment of the above-described magnetometer having a sensing head module 150 separate from a signal processing module 152. By separating the sensing head module 150 from the electronics in the signal processing module 152, magnetic interference from the electronics is minimized. In addition, the sensing head module 150 may be made more compact. In one embodiment, the signal processing module 150 includes pump light source 100 and probe light source 106. The atomic vapor chamber 102 is located within the sensing head module 150. The pump light beam 101 may be conveyed to the chamber 102 through a pump fiber optic cable 154. Similarly, the probe light beam 108 may be conveyed to the chamber 102 through a probe fiber optic cable 156. In some embodiments, the fiber optic cables 154 and 156 comprise polarization maintaining fibers (e.g., comprising angle polished interfaces).

As described above, after passing through the chamber 102, the pump light beam 101 may be absorbed by absorber 104. The polarization of the probe light beam may be detected by polarization detector 110 located within the sensing head module 150, which sends an electrical signal corresponding to the polarization angle back to the signal processing module 152 over a wire 158. The wire 158 and fiber optic cables 154 and 156 may be packaged into a single cable 160.

The frequency of modulation of the polarization angle signal may be detected by a frequency counter 162 and then passed to a modulator driver 112 that controls the modulation of the pump light source 100. As described above, the feedback loop induces self-oscillation at the resonant frequency. Thus, the frequency detected by the frequency counter 162 corresponds to the magnetic field strength. Appropriate processors and other electronics may be incorporated within the signal processing module 152 for controlling the system and calculating, displaying, and/or storing the magnetic field strength.

Figure 3:
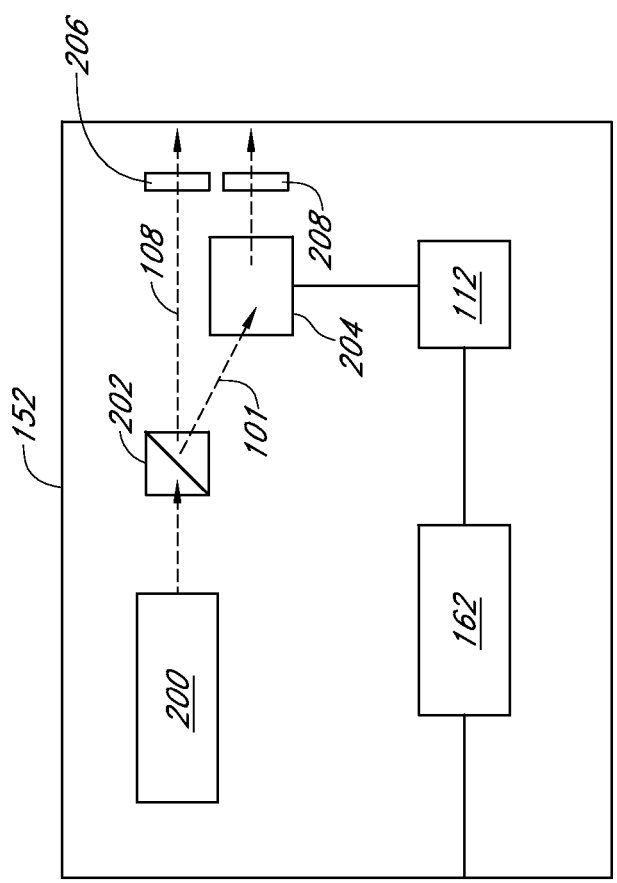
FIG. 3 is a system block diagram of a signal processing module in an optical atomic magnetometer.

One embodiment of the signal processing module 152 is depicted in the system block diagram of FIG. 3. A single laser source 200 is provided for both the pump and probe light beams. Any suitable laser may be used. In one embodiment, the laser source 200 is a distributed feedback laser frequency-controlled by a dichroic atomic vapor laser lock (DAVLL). The laser output may be split with splitter 202 into pump 101 and probe 108 beams. In an alternative embodiment, two separate vertical-cavity surface-emitting diode lasers may be used for pump and probe light sources (e.g., on the D1 line of rubidium). The pump beam 101 is frequency or amplitude modulated by modulator 204. In one embodiment, the modulator 204 is an acousto-optic modulator. In another embodiment, the modulator 204 is an inline fiber-optic Mach-Zehnder lithium niobate interferometric modulator. The pump 101 and probe 108 beams may then pass through linear polarizers 206 and 208 before passing through fiber optic cables to the sensing head module. As discussed above, the relative polarizations of the pump 101 and probe 108 beams may be controlled to effect a 90° phase shift in probe polarization rotation. These relative polarizations may be adjusted by mechanical rotation of one or more of the polarizers 206 and 208. In some embodiments, the adjustment may be made once at the time of magnetometer manufacture. In other embodiments, subsequent adjustment may be permitted. In one embodiment, the polarization adjustment may be automated. Those of skill in the art will appreciate any number of alternative components that may be used in generating polarized pump and probe light and modulating pump light.

As described above with respect to FIG. 2, the signal processing module 152 may also include a frequency detector 162 and a modulator driver 112. The frequency detector 162 may be used to determine the external magnetic field strength from the detected probe polarization modulation. The modulator driver 112 is used to drive the modulator 204.

In one embodiment, the polarization rotation signal detected in the sensing head module is sinusoidal. In one such embodiment, the modulator driver 112 includes a pulse generator that is triggered on the negative-going zero-crossings of the sinusoid polarization rotation signal (e.g., using a Schmitt trigger). The generated pulses may then switch on and off a radiofrequency power source for driving an acousto-optical modulator 204.

Figure 4:
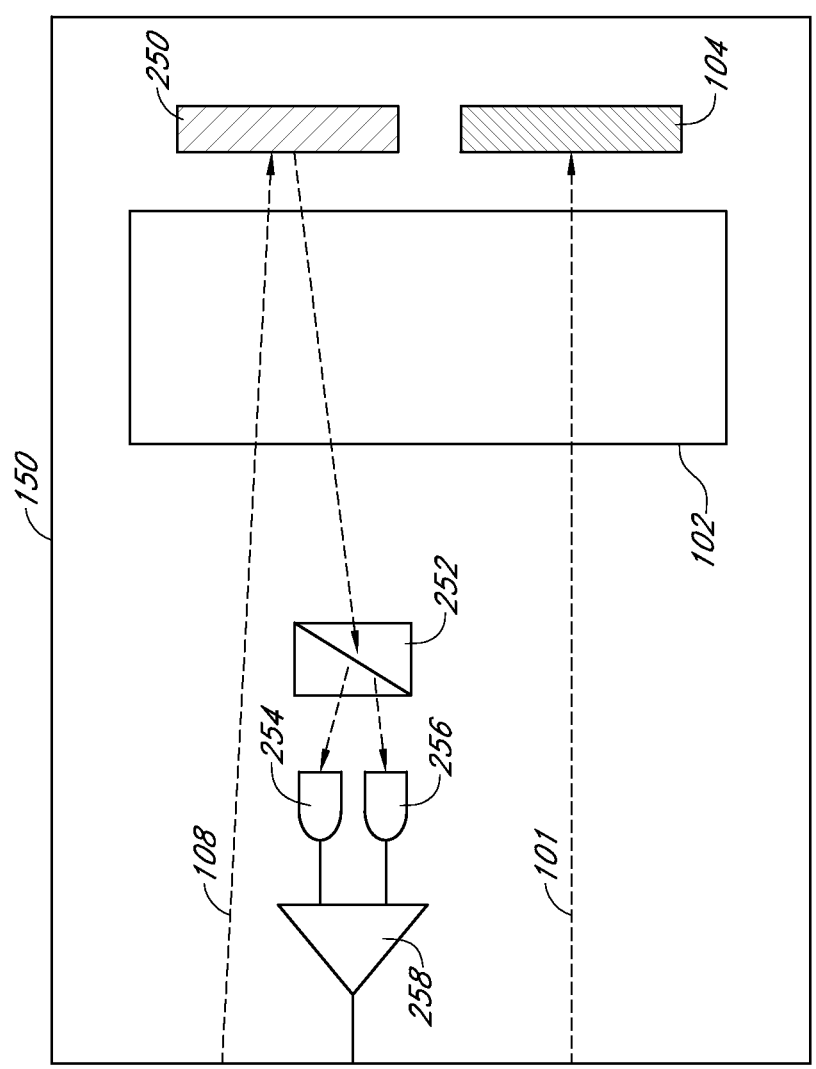
FIG. 4 is a system block diagram of a sensing head module in an optical atomic magnetometer.

One embodiment of a sensing head module 150 is depicted in the system block diagram of FIG. 4. The optical pumping beam 101 enters the module 150 via fiber optic connection to the source located in the signal processing module 152. The beam 101 passes through the atomic vapor chamber 102 and is absorbed by absorber 104. Similarly, the probe beam 108 enters the module 150 via fiber optic connection and is directed through the chamber 102. In one embodiment, the polarization rotation detector may be located on the other side of the chamber 102. However, in another embodiment, as depicted in FIG. 4, a mirror 250 may used to reflect the probe beam 108 back through the chamber 102, resulting in a double pass of the beam 108 through the chamber 102. In one embodiment, the mirror is a retro-reflector to minimize the need for accurate beam alignment.

In one embodiment, the polarization rotation detector includes a Rochon polarizer 252 that splits the polarization components of the probe beam 108. The amplitude of each component is then detected by photodiodes 254 and 256. The difference photocurrent can then be amplified with a low-noise transimpedance amplifier 258 and the resulting signal transmitted back to the signal processing module. In one alternative embodiment, the polarization rotation detector includes a polarizer nearly orthogonal to the unrotated probe polarization followed by a large-area avalanche photodiode module.

In one alternative embodiment, the polarization rotation detector is located in the signal processing module instead of the sensing head module 150. In this embodiment, after reflection from the mirror 250, the probe beam 108 may be directed into a third fiber optic cable leading back to the signal processing module where it is directed onto a polarization rotation detector such as described above. In this embodiment, the sensing head module 150 may be constructed without using any metallic components, thereby reducing magnetic interference and improving accuracy.

Figure 5:
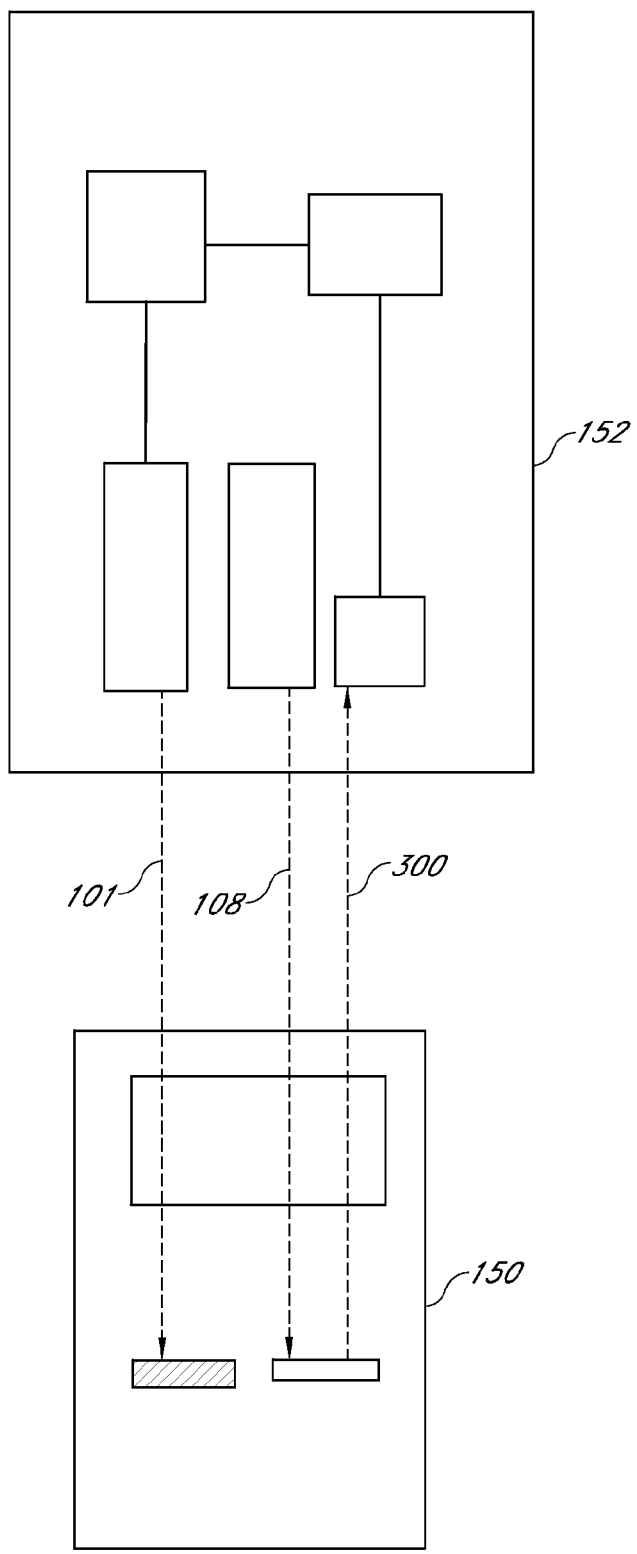
FIG. 5 is a system block diagram of an optical atomic magnetometer utilizing free-space transmission of light between a signal processing module and a sensing head module.

In still another alternative embodiment, depicted by the system block diagram of FIG. 5, optical pump beam 101 and probe beam 108 may be transmitted through space instead of through optical cables from the signal processing module 152 to the sensing head module 150. Likewise, the reflected probe beam 300 is transmitted through space back to the signal processing module 152 for detection and processing. This through-space scheme may be utilized to obtain readings from sensing modules remotely, such as from aircraft or spacecraft.

Figure 6:
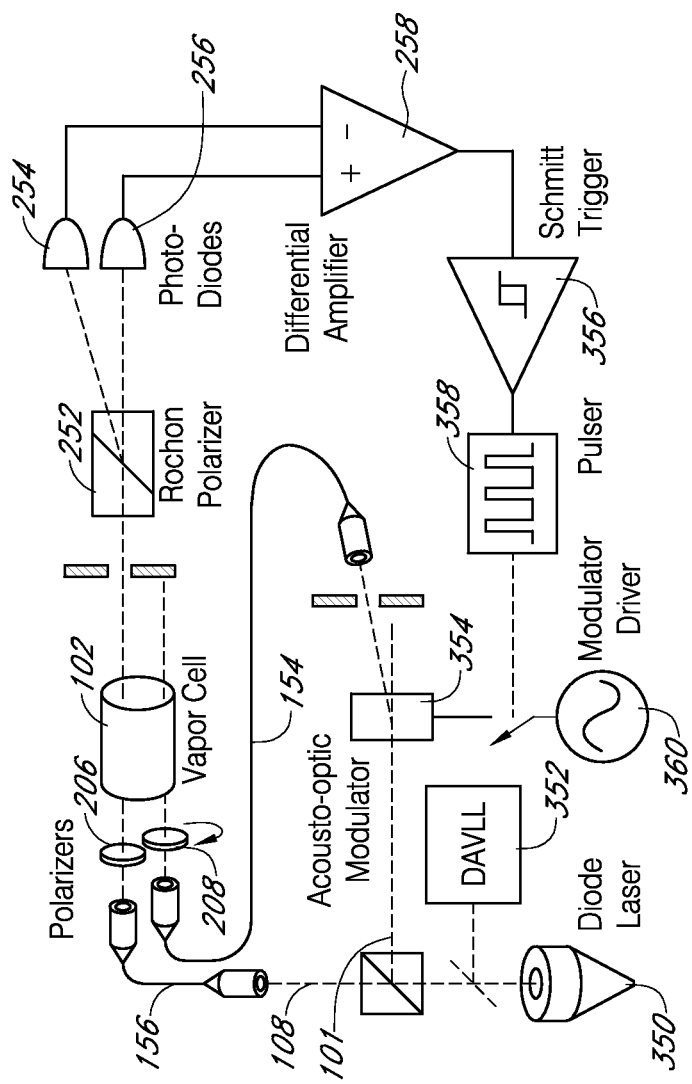
FIG. 6 is a system block diagram of a laboratory prototype of an optical atomic magnetometer.

Laboratory and field magnetometers operating according to the principles described above were constructed and tested. A system block diagram of the laboratory model is depicted in FIG. 6. A single external-cavity diode laser 350 controlled by a dichroic atomic vapor laser lock 352 was split into pump 101 and probe 108 beams. The laser wavelength was on the D2 line of rubidium, frequency stabilized approximately 300 MHz below the center of the F=2→F' Doppler-broadened line. The pump beam 101 was modulated using an acousto-optic modulator 354. The pump 101 and probe 108 beams were directed through fiber optic cables 154 and 156 through polarizers 208 and 206 into a rubidium vapor cell 102. The probe beam 108 was then passed through a Rochon polarizer 252 and detected using photodiodes 254 and 256. The photodiode output was directed to a differential amplifier 258. The difference photocurrent was amplified with a low-noise transimpedance amplifier and passed through a resonant LC filter centered at 20 kHz with a bandwidth of 11 kHz to reduce jitter. The resulting sinusoidal output was used to control the modulator 354 utilizing a Schmitt trigger 356 to trigger a pulse generator 358 which controlled a radiofrequency power source 360 connection to the modulator 354. The photodiode 254 and 256 signal was monitored with an oscilloscope and frequency counter.

The vapor cell 102 was placed in a three-layer cylindrical magnetic shield, provided with internal coils for the generation of a stable, well-defined magnetic bias field and gradients. The cell consisted of a cylindrical paraffin-coated 2 cm in diameter and length glass cell containing $5 \times 10^{10}$ cm$^{-3}$ $^{87}$Rb. The density was maintained by heating the interior of the magnetic shields to around 40° C. with a forced-air heat exchanger.

Optimum settings for the magnetometer sensitivity were found to be approximately 7 µW mean incident pump power, 7 µW continuous incident probe power, and optical absorption of around 60% at the lock point. A sensitivity of 3 nG was achieved for a measurement time of 1 s at these settings.

Figure 7A:
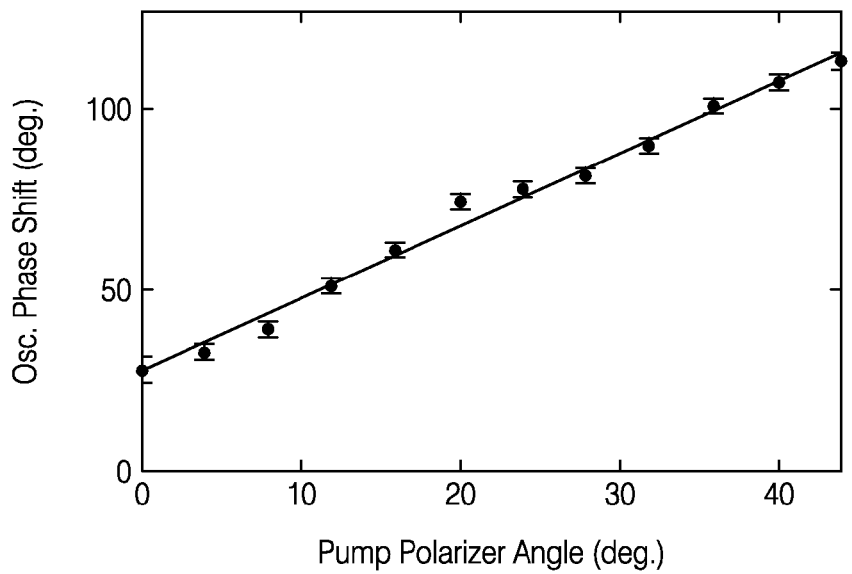
FIGS. 7A and 7B are graphs depicting the detected phase shift as a function of pump polarizer angle and oscillation frequency as a function of applied phase shift in the magnetometer of FIG. 6.
Figure 7B:
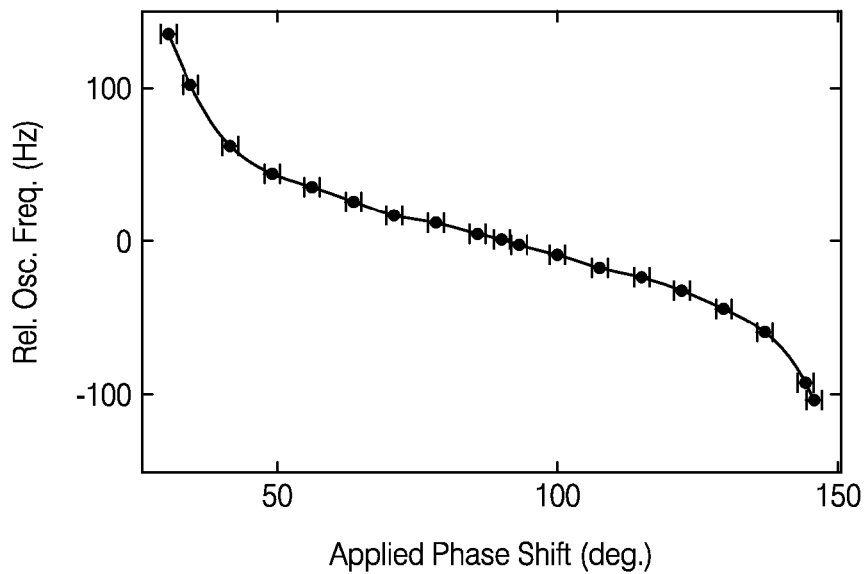

To demonstrate the optical phase shift of the polarization-rotation signal, a measurement of the phase shift of the signal as a function of the pump polarizer angle was performed in an open-loop configuration, i.e., with an external frequency source modulating the pump power and with no feedback of the optical-rotation signal. FIG. 7A is a graph depicting the resulting phase shift curve as a function of pump polarizer angle, revealing the expected linear dependence. The observed slope is consistent with the value of 2 expected from the fact that the optical-rotation signal undergoes two cycles as the atomic alignment rotates by 360°. The effects of a phase shift in the feedback network on the oscillation frequency of the self-oscillating, closed-loop magnetometer are shown in the graph of FIG. 7B, which depicts the relative oscillation frequency as a function of applied phase shift. As expected, the magnetometer adjusts its oscillation frequency so that the phase shift of the NMOR resonance cancels that of the feedback network. Since the phase shift of the NMOR resonance is an arctangent function of the detuning from resonance (similar to a damped harmonic oscillator), this results in a change in oscillation frequency which is proportional to the tangent of the applied phase shift.

Figure 8A:
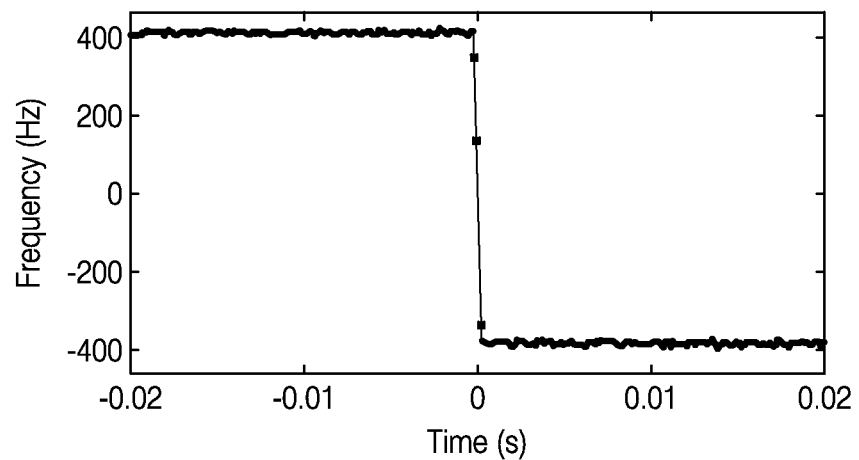
FIGS. 8A and 8B are graphs of oscillation frequency and applied current in the magnetometer of FIG. 6 in response to a step in external magnetic field strength.
Figure 8B:
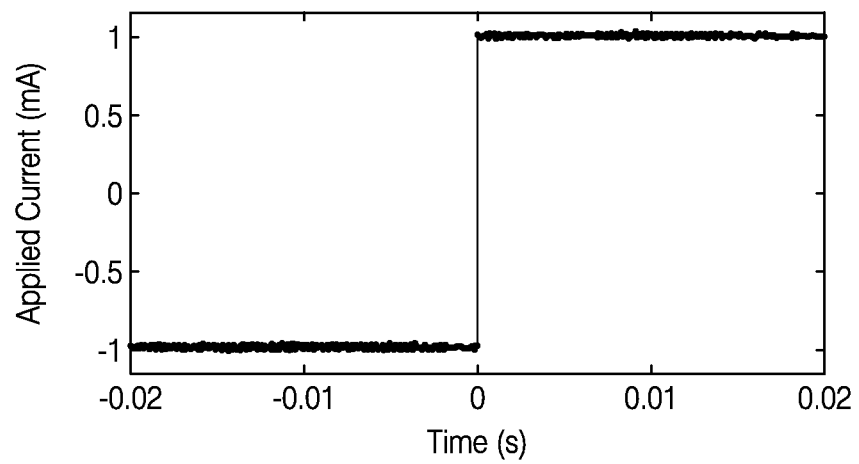

In order to assess the bandwidth of the magnetometer, the response to rapid changes in magnetic field was investigated by applying a small modulation to the bias magnetic field. In one measurement, a slow square-wave modulation was superimposed on the bias field via a separate Helmholtz coil inside the magnetic shield. The self-oscillation signal was then recorded on an oscilloscope and fit in each 500 µs window to a sinusoid. FIG. 8A is a graph depicting the magnetometer resonance frequency during a 570 µG field step. FIG. 8B is a graph depicting the bias current proportional to the field step. Tracking of the field step is quasi-instantaneous, without apparent overshoot or ringing.

Figure 9:
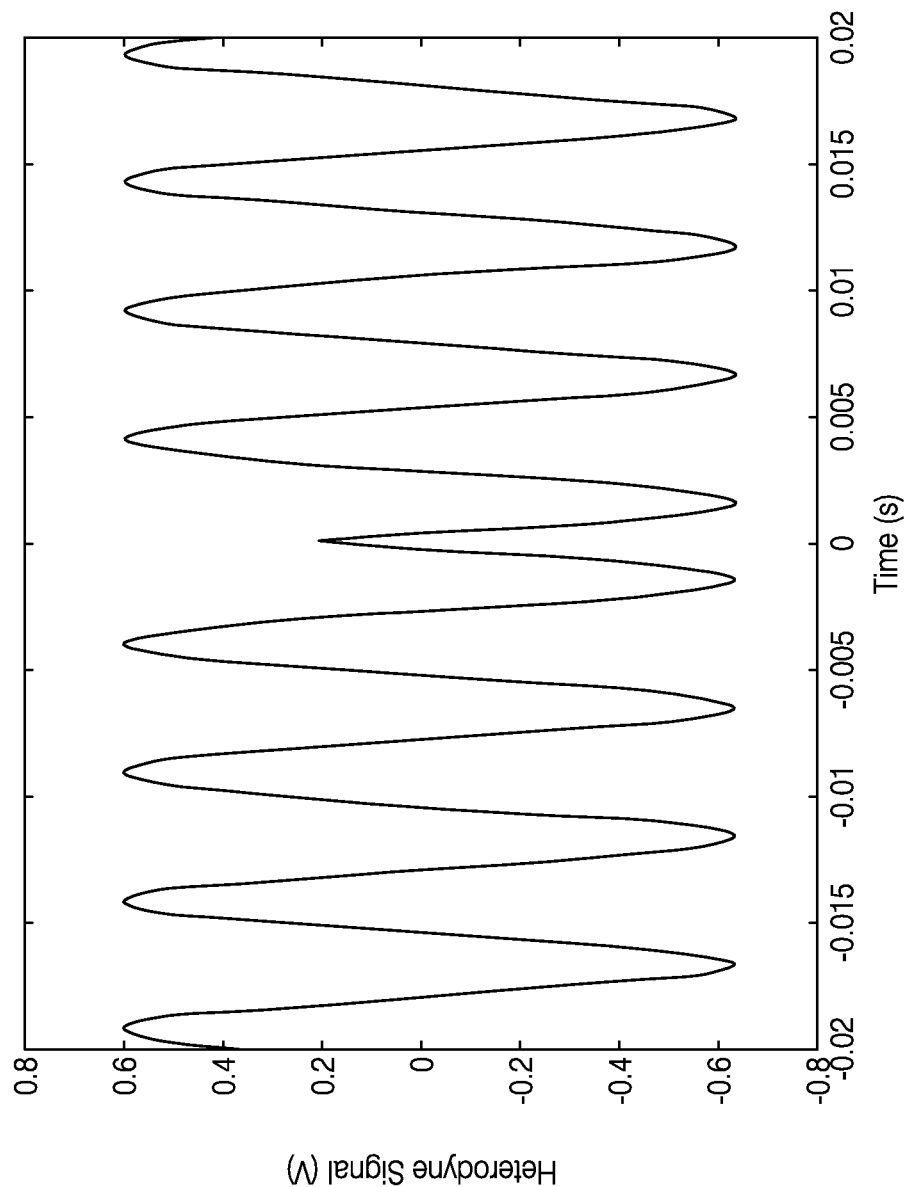
FIG. 9 is a graph depicting a change in a heterodyne signal in the magnetometer of FIG. 6 in response to a step in external magnetic field strength.

The magnetometer response was also monitored by heterodyning the oscillation frequency with a fixed reference frequency on a lock-in amplifier, with the lock-in time constant set to approximately the oscillation period (≈50 µs) to remove the sum-frequency component. The resulting low-frequency beat signal, which displayed large fractional frequency modulation, was also digitized and recorded on an oscilloscope. FIG. 9 depicts the modulation during the field step (at t=0 s). Inspection of the waveforms so obtained revealed the same sudden shift in the oscillation frequency as the magnetic field toggled between values. In a related experiment, the bias field received a small sinusoidal modulation, and the power spectrum of the self-oscillation waveform was observed on a spectrum analyzer. The sidebands were observed, offset from the oscillation (carrier) frequency by an amount equal to this bias-modulation frequency; their relative power was equal to that expected if the oscillator tracked the changing magnetic field with no delay or diminution of amplitude out to a bias-modulation frequency of at least 1 kHz.

Figure 10A:
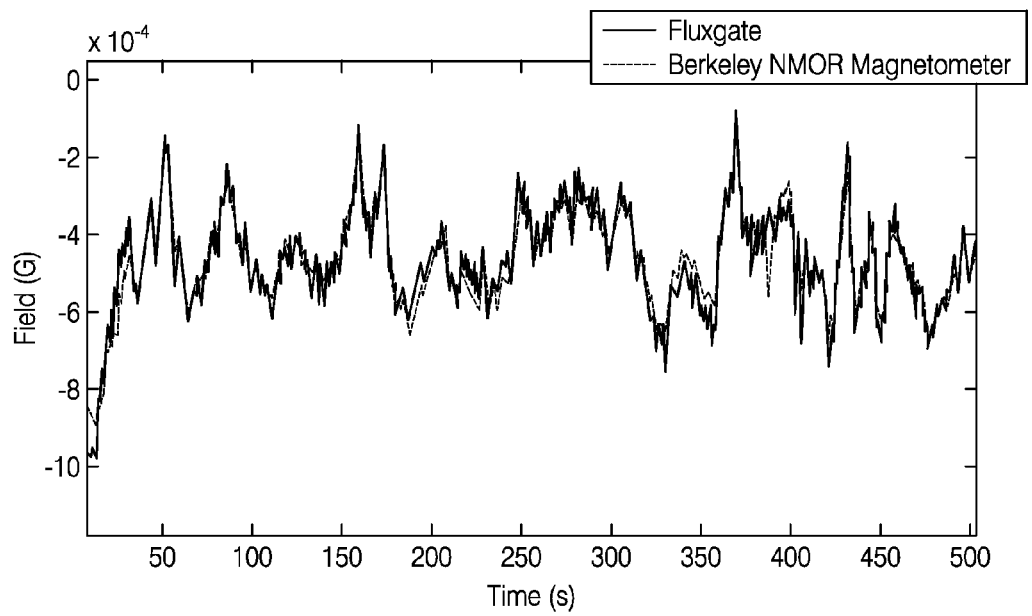
FIGS. 10A and 10B are graphs of magnetic field detected by an optical atomic magnetometer compared with a 3D fluxgate magnetometer.
Figure 10B:
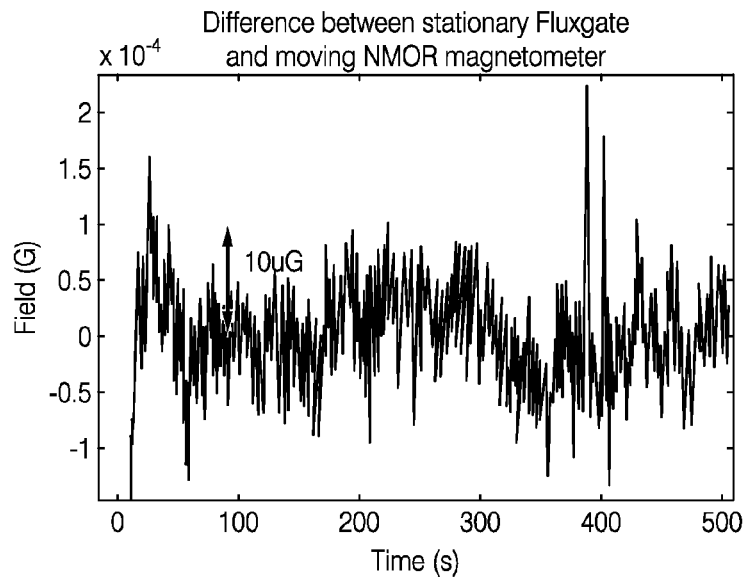

A field version of the magnetometer was constructed comprising a separate signal processing module and sensing head module as depicted to FIG. 2. Field testing was conducted outside in a relatively magnetically quiet location. The detected magnetic field was compared to commercially available magnetometers. One of the commercially available magnetometers included a 3D fluxgate magnetometer. FIG. 10A is a graph depicting the magnetic field measured by the NMOR magnetometer compared to that measured by the 3D fluxgate magnetometer demonstrating that the NMOR-based detection is comparable to the commercial magnetometer. FIG. 10B is a graph of the difference between a stationary 3D fluxgate magnetometer and a moving NMOR magnetometer showing field changes due to gradients of approximately 1 µG/cm.

Figure 11:
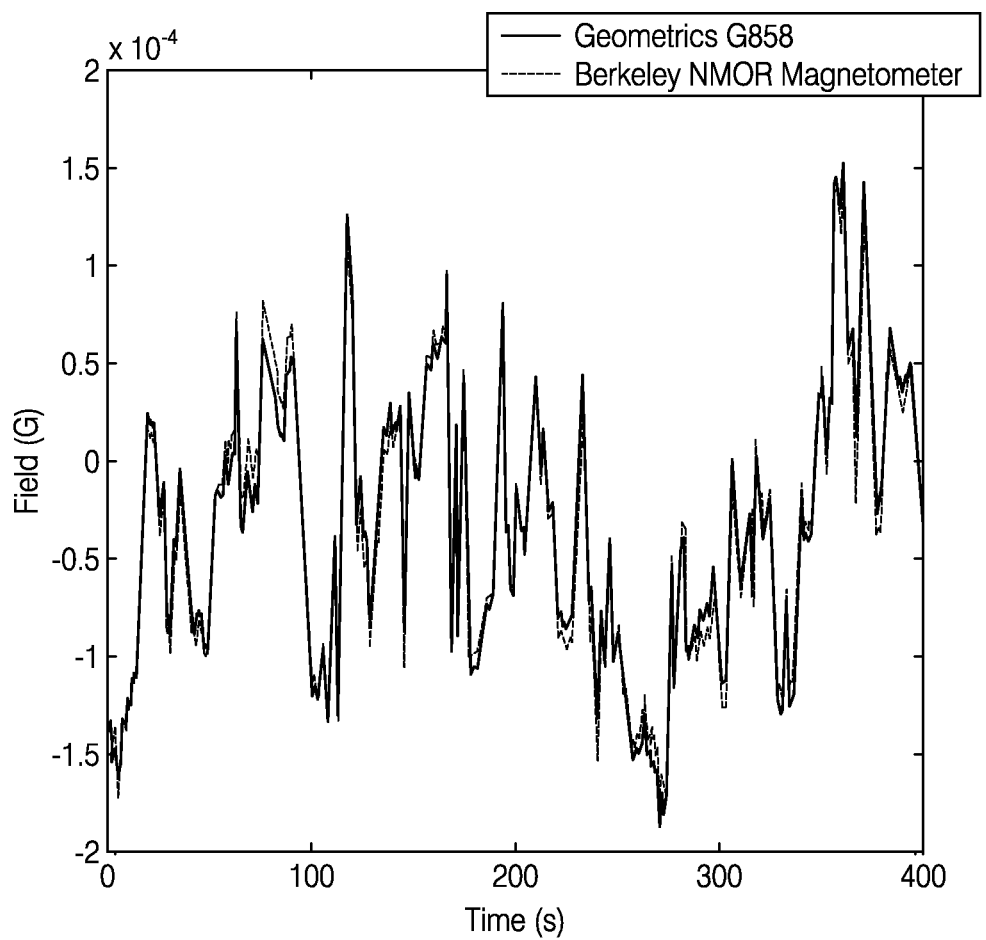
FIGS. 11, 12A, 12B, 13A, and 13B are graphs of magnetic field detected by an optical atomic magnetometer compared with a GEOMETRICS® G-858 magnetometer.
Figure 12A:
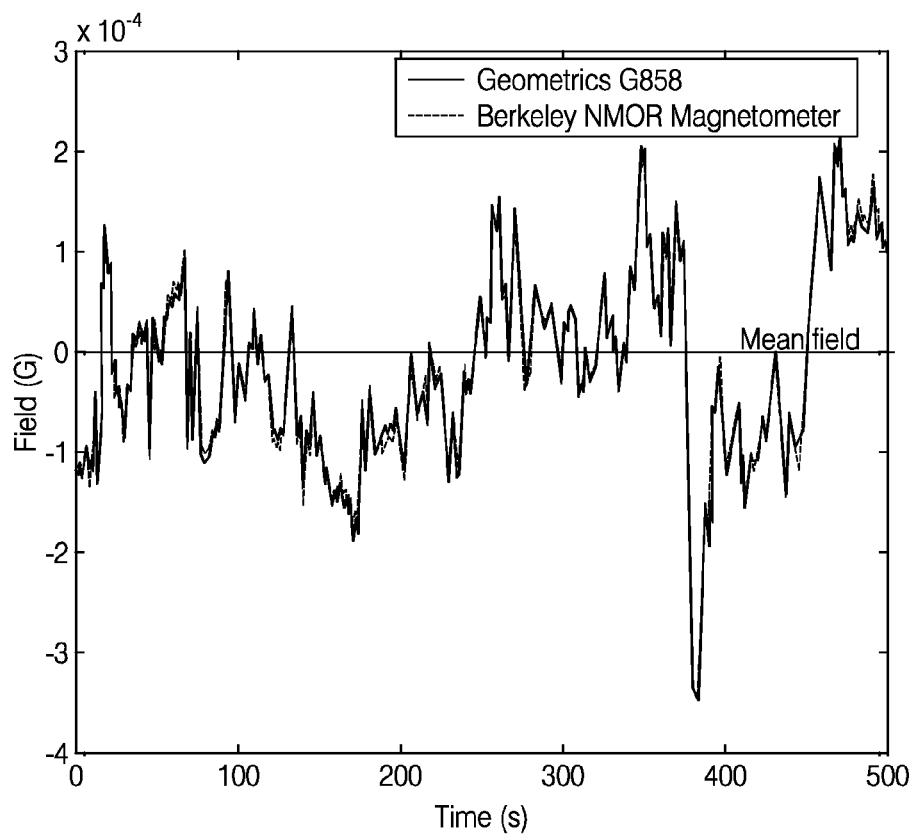
Figure 12B:
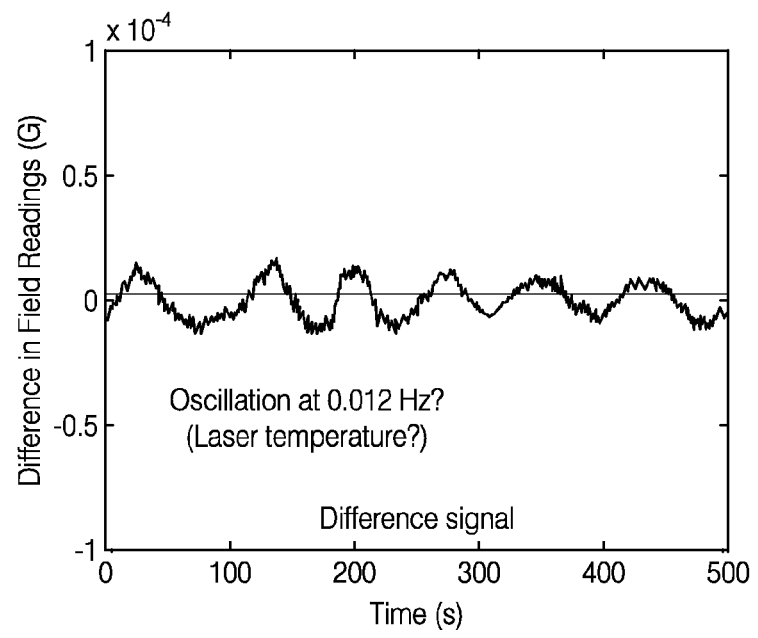
Figure 13A:
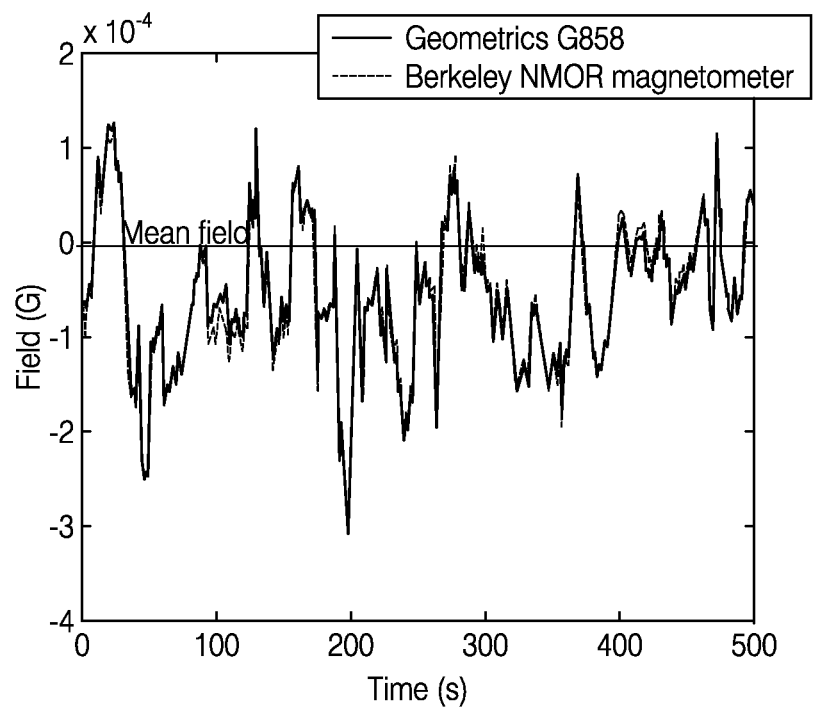
Figure 13B:
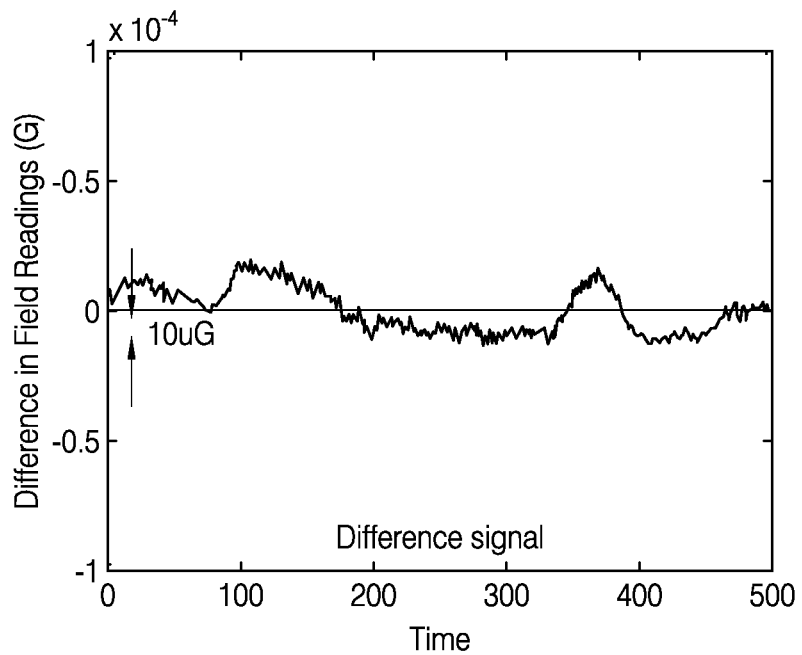

The NMOR magnetometer was also compared to a GEOMETRICS® G-858 magnetometer (Geometrics, Inc., San Jose, Calif.). The G-858 is a commercially available atomic magnetometer utilizing cesium. FIG. 11 is a graph depicting the magnetic field measured by the NMOR magnetometer compared to that measured by the G-858 magnetometer. As demonstrated by the graph, the measured magnetic field strengths are comparable. FIGS. 12A and 13A are graphs also comparing the magnetic field strength of the NMOR magnetometer with the G-858. The NMOR magnetometer and G-858 were positioned 1 m apart. FIGS. 12B and 13B are graphs of the difference field strengths for the same time periods corresponding to those in FIGS. 12A and 13A. These differences graphs demonstrate systematic error in the system, indicated that further improvements can be made. In the case of FIG. 12B, the difference signal oscillated at approximately 0.012 Hz, which may have been caused by the laser temperature.

Figure 14A:
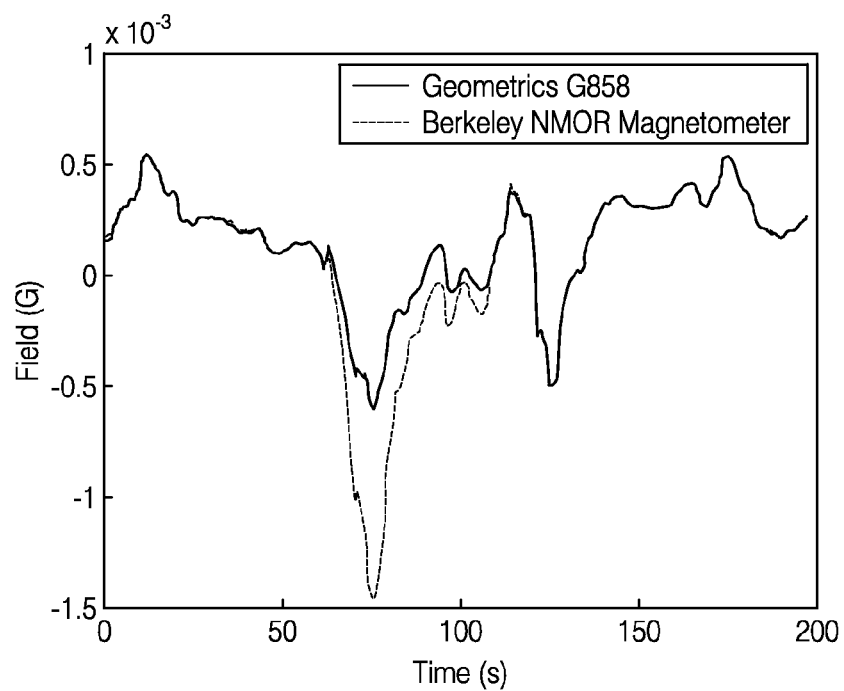
FIGS. 14A and 14B are graphs of magnetic field detected by an optical atomic magnetometer as a van is driven nearby compared with the field detected by a GEOMETRICS® G-858 magnetometer.
Figure 14B:
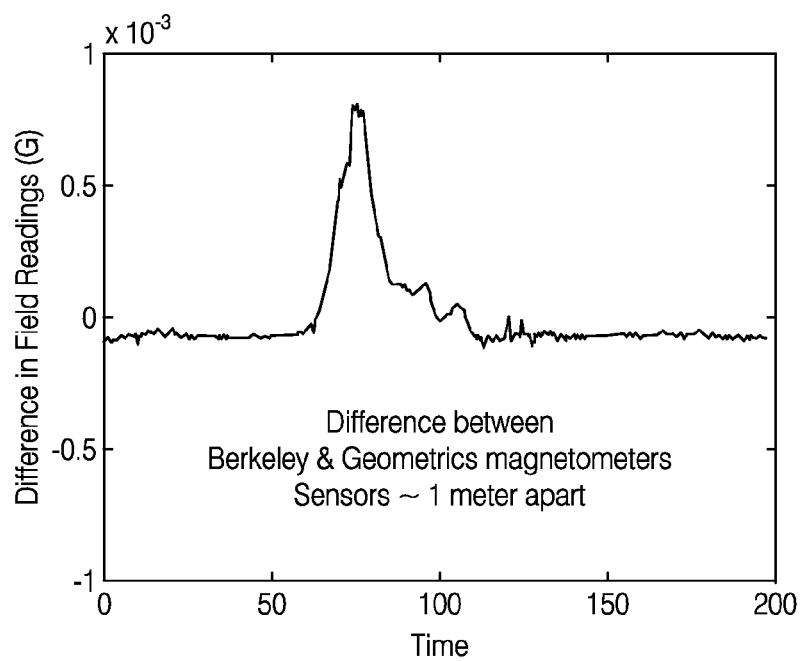

To test the potential use of the magnetometer as a vehicle detection system (e.g., for military applications), a van was driven in the vicinity of the NMOR magnetometer and the G-858 positioned 1 m apart. FIG. 14A depicts the measured field strengths. The large trough at approximately 75 s occurred when the van was in near proximity, demonstrating the utility of the magnetometer in vehicle detection. FIG. 14B is a graph depicting the difference between the NMOR magnetometer and the G-858. The significant difference measured in the presence of the van reflects the gradient in the field across the 1 m spacing of magnetometers.

Figure 15:
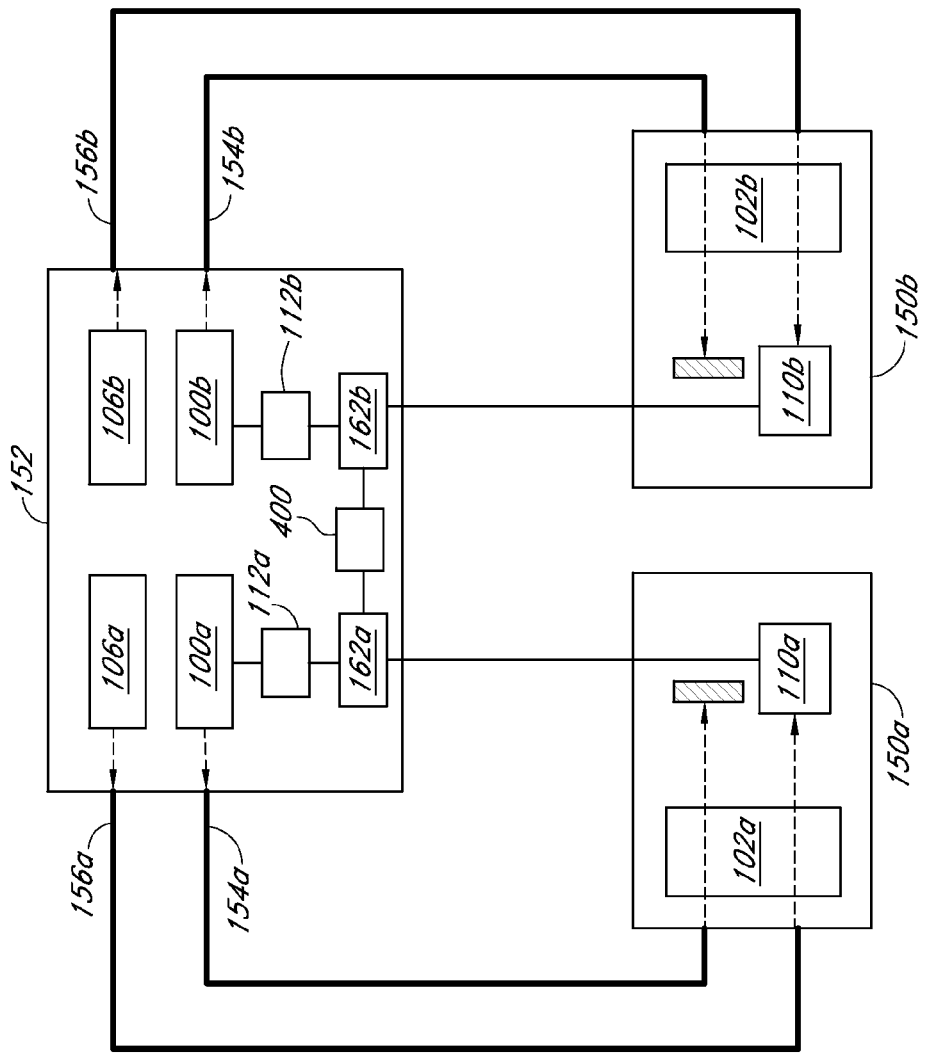
FIG. 15 is a system block diagram of an optical atomic gradiometer.

In some embodiments, any systematic errors in the detected magnetic field strength are reduced by using more than one magnetometer to create a gradiometer. For example, including two magnetometers in the sensing head module may be used for common-mode rejection. In addition, such gradiometers may be used for sensitive detection of magnetic field gradients, such as for detecting the presence of a metallic object as in the van experiment described above, by separating the two magnetometers by a certain distance. FIG. 15 is a system block diagram of one embodiment of a gradiometer using the magnetometer system described herein. Two sensing head modules 150a and 150b are provided and are connected via fiber optic and electrical cabling to a single signal processing module 152. The signal processing module comprises two optical pump light sources 100a and 100b and two probe light sources 106a and 106b. In one embodiment, a single laser light source is used, which when combined with splitters, modulators, and polarizers, create the four light sources. The light is transmitted to the respective sensing head modules 150a and 150b via fiber optic cables 154a, 156a, 154b, and 156b. Each sensing head module 150a and 150b comprises an atomic vapor chamber 102a and 102b and a polarization rotation detector 110a and 110b. The detectors 110a and 110b are connected via electrical cabling to the signal process module 152 to separate frequency counters 162a and 162b. The frequency difference is determined by frequency difference module 400. In one embodiment, the frequency difference module 400 operates by mixing the two respective signals and determining the frequency of the resulting beat signal. The frequency difference may then be used to output the magnetic field difference between the two sensing head modules 150a and 150b. The respective modulations from the polarization rotation detectors 110a and 110b are then fed to modulation drivers 112a and 112b to separately modulate the light produced by the pump light sources 100a and 100b, thereby inducing self-oscillation in each chamber 102a and 102b at their respective resonant frequencies.

Potential uses of the magnetometers and gradiometers described above include, but are not limited to, detection of unexploded ordnance, location of buried objects at land or sea, mining surveys, detection of submarines and mines, detection of vehicles, detection of signals from the brain (magnetoencephalography) or heart (magnetocardiography), magnetic-resonance imaging, detection of planetary and solar magnetic fields using space-based platforms, and detection of an electric dipole moment in elementary particles.

Although the invention has been described with reference to embodiments and examples, it should be understood that numerous and various modifications can be made without departing from the spirit of the invention. Accordingly, the invention is limited only by the following claims.

What is claimed is:

1. A magnetometer, comprising:
   a container comprising atomic vapor;
   a first linearly polarized light source configured to irradiate the atomic vapor;
   a second linearly polarized light source configured to transmit light through the atomic vapor;
   a light polarization detector configured to detect a polarization angle of the light transmitted through the atomic vapor from the second linearly polarized light source; and
   a light modulator configured to modulate the frequency or amplitude of light emitted by the first linearly polarized light source in response to the polarization detected by the light polarization detector.

2. The magnetometer of claim 1, wherein the container comprises an interior paraffin coating.

3. The magnetometer of claim 1, wherein the atomic vapor comprises an alkali metal.

4. The magnetometer of claim 1, wherein the atomic vapor comprises rubidium.

5. The magnetometer of claim 1, wherein the polarization of light from the first light source is not parallel to the polarization of light from the second light source.

6. The magnetometer of claim 1, wherein light generated for the first light source and the second light source come from a single laser.

7. The magnetometer of claim 1, wherein the first light source comprises a polarizer.

8. The magnetometer of claim 1, wherein the second light source comprises a polarizer.

9. The magnetometer of claim 1, wherein the light polarization detector comprises a Rochon polarizer.

10. The magnetometer of claim 1, wherein the light polarization detector comprises a photodetector.

11. The magnetometer of claim 1, wherein the light modulator comprises an Mach-Zehnder modulator.

12. The magnetometer of claim 1, comprising a frequency counter.

13. The magnetometer of claim 12, comprising a processor configured to determine a magnetic field strength based on a frequency determined by the frequency counter.

14. The magnetometer of claim 1, wherein the container and light polarization detector are located in a first housing and the first and second light sources and light modulator are located in a second housing.

15. The magnetometer of claim 14, comprising:
    a first fiber optic cable configured to direct light from the first light source to the atomic vapor; and
    a second fiber optic cable configured to direct light from the second light source to the atomic vapor.

16. The magnetometer of claim 1, wherein the container is located in a first housing and the first and second light sources, light modulator, and light polarization detector are located in a second housing.

17. The magnetometer of claim 16, comprising:
    a first fiber optic cable configured to direct light from the first light source to the atomic vapor;
    a second fiber optic cable configured to direct light from the second light source to the atomic vapor; and
    a third fiber optic cable configured to direct light transmitted through the atomic vapor to the light polarization detector.

18. A gradiometer, comprising at least two magnetometers according to claim 1.

19. A method for detecting magnetic field strength, the method comprising:
    optically pumping an atomic vapor such that the vapor becomes dichroic or birefringent;
    transmitting non-modulated linearly polarized light through the atomic vapor;
    detecting a modulation of polarization angle of the transmitted light; and
    modulating the optical pumping of the atomic vapor in response to the detected modulation of polarization angle.

20. The method of claim 19, wherein the optical pumping is modulated in phase with the detected modulation of polarization angle.

21. The method of claim 19, wherein the optical pumping comprises irradiating the vapor with linearly polarized light.

22. The method of claim 21, comprising adjusting the relative polarization angle between the light used for the optical pumping and the non-modulated linearly polarized light such that the detected modulation of the polarization angle is in phase with the optical pumping modulation.

23. The method of claim 19, wherein the modulation of the polarization angle is substantially sinusoidal.

24. The method of claim 19, wherein modulating the optical pumping comprises modulating the frequency of the pumping light.

25. The method of claim 19, wherein modulating the optical pumping comprises modulating the amplitude of the pumping light.

26. The method of claim 19, wherein the modulation of the optical pumping is a pulsed modulation.

* * * * *